US007748944B2

(12) United States Patent
Price et al.

(10) Patent No.: US 7,748,944 B2
(45) Date of Patent: Jul. 6, 2010

(54) METHOD AND APPARATUS FOR SEMICONDUCTOR PROCESSING

(75) Inventors: JB Price, Los Gatos, CA (US); Jed Keller, Los Gatos, CA (US); Laurence Dulmage, Nevada City, CA (US); David Cheng, Sunnyvale, CA (US)

(73) Assignee: Crossing Automation, Inc., Mountain View, CA (US)

( * ) Notice: Subject to any disclaimer, the term of this patent is extended or adjusted under 35 U.S.C. 154(b) by 0 days.

(21) Appl. No.: 11/929,357

(22) Filed: Oct. 30, 2007

(65) Prior Publication Data

US 2008/0089774 A1 Apr. 17, 2008

Related U.S. Application Data

(62) Division of application No. 10/927,703, filed on Aug. 27, 2004, now abandoned.

(60) Provisional application No. 60/496,479, filed on Aug. 29, 2003.

(51) Int. Cl.
B65G 49/07 (2006.01)
(52) U.S. Cl. .................. 414/805; 414/217; 414/939
(58) Field of Classification Search ................ 414/217, 414/221, 939, 805
See application file for complete search history.

(56) References Cited

U.S. PATENT DOCUMENTS

| 3,968,885 | A | * | 7/1976 | Hassan et al. ............... 414/591 |
| 4,141,458 | A | | 2/1979 | Brooks et al. |
| 4,311,427 | A | | 1/1982 | Coad et al. |
| 4,611,966 | A | | 9/1986 | Johnson |
| 4,664,578 | A | * | 5/1987 | Kakehi ........................ 414/217 |
| 4,763,602 | A | * | 8/1988 | Madan et al. ............... 118/719 |
| 4,886,412 | A | | 12/1989 | Wooding et al. |
| 5,000,682 | A | | 3/1991 | Heidt et al. |
| 5,046,909 | A | | 9/1991 | Murdoch |
| 5,067,218 | A | * | 11/1991 | Williams ................... 29/25.01 |
| 5,217,340 | A | | 6/1993 | Harada et al. |
| 5,236,295 | A | | 8/1993 | Ishii et al. |
| 5,380,137 | A | | 1/1995 | Wada |

(Continued)

FOREIGN PATENT DOCUMENTS

EP 0 217 616 A3 9/1986

(Continued)

OTHER PUBLICATIONS

International Search Report for International Patent Application No. PCT/US04/28212, International filing date Aug. 27, 2004.

(Continued)

*Primary Examiner*—James Keenan
(74) *Attorney, Agent, or Firm*—Martine Penilla & Gencarella, LLP (57) ABSTRACT

A method and apparatus for semiconductor processing is disclosed. In one embodiment, a method of transporting a wafer within a cluster tool, comprises placing the wafer into a first segment of a vacuum enclosure, the vacuum enclosure being attached to a processing chamber and a factory interface. The wafer is transported to a second segment of the vacuum enclosure using a vertical transport mechanism, wherein the second segment is above or below the first segment.

17 Claims, 13 Drawing Sheets

U.S. PATENT DOCUMENTS

| | | | |
|---|---|---|---|
| 5,417,537 A * | 5/1995 | Miller | 414/217 |
| 5,516,732 A | 5/1996 | Flegal | |
| 5,547,515 A | 8/1996 | Kudo et al. | |
| 5,647,718 A | 7/1997 | Wiesler et al. | |
| 5,741,109 A | 4/1998 | Wiesler et al. | |
| 5,779,425 A | 7/1998 | Grützediek et al. | |
| 5,788,447 A | 8/1998 | Yonemitsu et al. | |
| 5,879,459 A | 3/1999 | Gadgil et al. | |
| 5,909,994 A * | 6/1999 | Blum et al. | 414/217 |
| 5,944,940 A * | 8/1999 | Toshima | 156/345.29 |
| 6,053,686 A * | 4/2000 | Kyogoku | 414/217 |
| 6,053,980 A * | 4/2000 | Suda et al. | 118/719 |
| 6,059,507 A * | 5/2000 | Adams | 414/217 |
| 6,146,077 A | 11/2000 | Shin et al. | |
| 6,174,377 B1 | 1/2001 | Doering et al. | |
| 6,176,667 B1 | 1/2001 | Fairbairn et al. | |
| 6,183,615 B1 | 2/2001 | Yasar et al. | |
| 6,287,386 B1 | 9/2001 | Perlov et al. | |
| 6,303,906 B1 | 10/2001 | Yoo | |
| 6,337,467 B1 | 1/2002 | Sik | |
| 6,345,150 B1 | 2/2002 | Yoo | |
| 6,379,095 B1 * | 4/2002 | Elliott et al. | 414/279 |
| 6,395,648 B1 | 5/2002 | Yoo | |
| 6,410,455 B1 | 6/2002 | Kuribayashi et al. | |
| 6,500,737 B1 | 12/2002 | Yoo | |
| 6,565,304 B2 | 5/2003 | Martin et al. | |
| 6,568,899 B1 | 5/2003 | Kuribayashi et al. | |
| 6,602,797 B2 | 8/2003 | Kuribayashi et al. | |
| 6,610,150 B1 | 8/2003 | Savage et al. | |
| 6,663,340 B1 | 12/2003 | Zeakes et al. | |
| 6,734,950 B2 * | 5/2004 | Nakano | 355/72 |
| 6,818,067 B2 | 11/2004 | Doering et al. | |
| 6,840,763 B2 | 1/2005 | Sik | |
| 6,846,149 B2 | 1/2005 | Savage et al. | |
| 6,887,803 B2 | 5/2005 | Yoo | |
| 6,897,162 B2 | 5/2005 | Yoo | |
| 6,930,050 B2 * | 8/2005 | Kim et al. | 438/716 |
| 6,952,889 B2 | 10/2005 | Yoo | |
| 7,210,246 B2 | 5/2007 | Van der Meulen | |
| 2001/0014268 A1 * | 8/2001 | Bryson et al. | 414/217 |
| 2001/0041120 A1 * | 11/2001 | Hofmeister | 414/217 |
| 2005/0111938 A1 | 5/2005 | Van der Meulen | |
| 2005/0111956 A1 | 5/2005 | van der Meulen | |
| 2005/0113964 A1 | 5/2005 | van der Meulen | |
| 2005/0113976 A1 | 5/2005 | Van der Meulen | |
| 2005/0118009 A1 | 6/2005 | Van der Meulen | |
| 2005/0223837 A1 | 10/2005 | Van der Meulen | |
| 2006/0263177 A1 | 11/2006 | Van der Meulen | |
| 2007/0135932 A1 | 6/2007 | Pannese | |
| 2007/0135933 A1 | 6/2007 | Panesse et al. | |
| 2007/0144421 A1 | 6/2007 | Kiley | |

FOREIGN PATENT DOCUMENTS

| | | | |
|---|---|---|---|
| EP | 0 2280901 A2 | 12/1986 | |
| EP | 0 809 278 A3 | 5/1997 | |
| EP | 1 283 544 A2 | 8/2002 | |
| GB | 2 135 120 A | 12/1980 | |
| JP | 6-104326 * | 4/1994 | 414/939 |
| WO | WO 2005022602 | 3/2005 | |

OTHER PUBLICATIONS

Mark Lapedus, Invest in fab-tool maker BlueShift, EETimes.com—Intel invests in fab-tool maker BlueShift, Jul. 10, 2006, San Francisco, California.

* cited by examiner

METHOD AND APPARATUS FOR SEMICONDUCTOR PROCESSING

RELATED APPLICATION

This application is a divisional of application Ser. No. 10/927,703 filed on Aug. 27, 2004 now abandoned which is fully incorporated herein by reference. This application also claims the benefit of U.S. Provisional Application Ser. No. 60/496,479, filed on Aug. 29, 2003. The contents of U.S. Provisional Application Ser. No. 60/496,479 are incorporated herein by reference in their entirety.

FIELD OF THE INVENTION

The field of the invention relates generally to semiconductor manufacturing equipment and pertains particularly to vacuum equipment for enabling sequential processing under vacuum, using different process environments, such as cluster tools.

BACKGROUND

Figure 1:
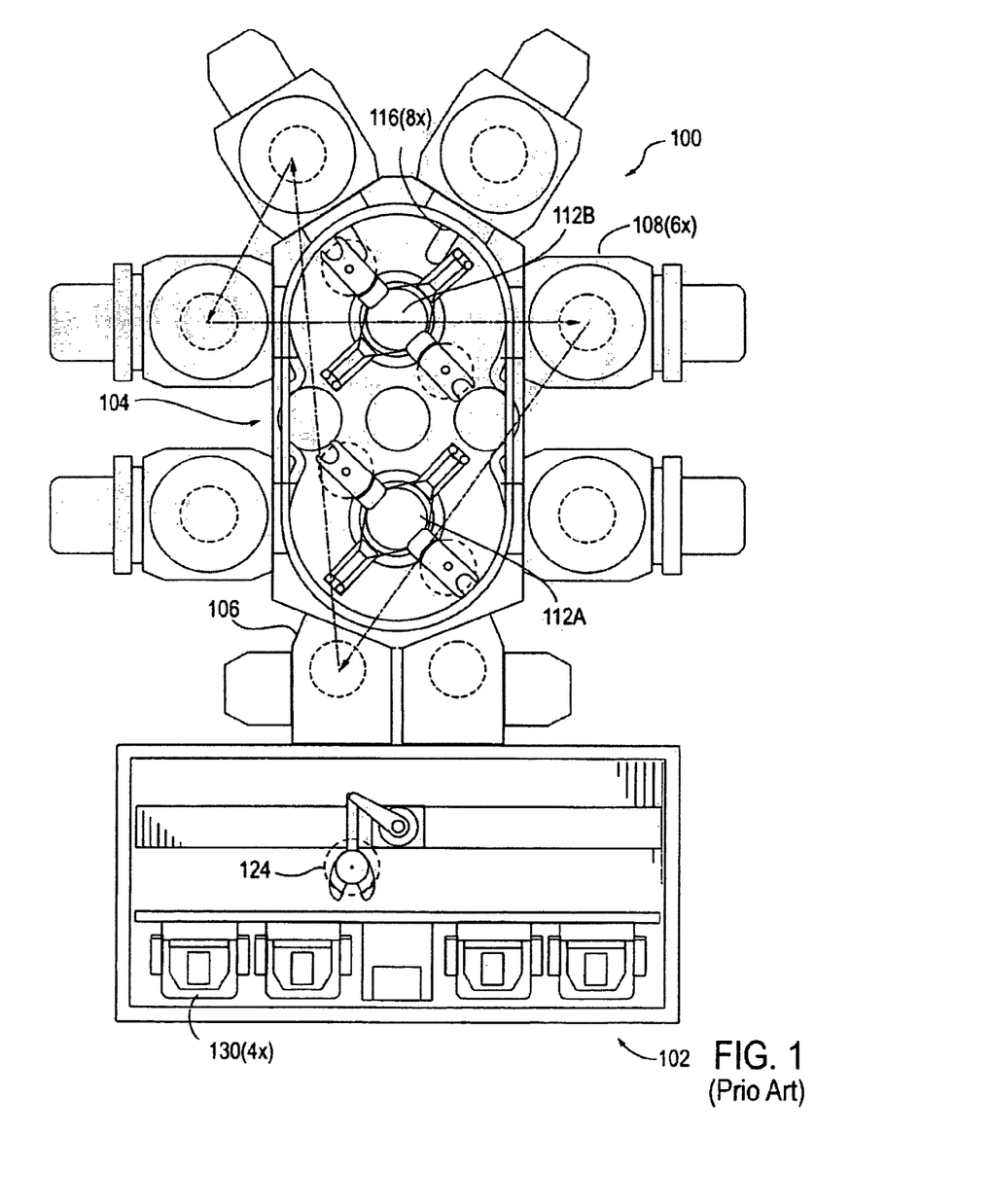
FIG. 1 illustrates a prior art semiconductor processing system 100 for performing sequential processes.

Semiconductor substrate processing is typically performed by subjecting a substrate to a plurality of sequential processes to create devices, conductors and insulators on the substrate. FIG. 1 illustrates a prior art semiconductor processing system 100 for performing sequential processes. These processes are generally performed in a processing chamber configured to perform a single step of the production process. In order to efficiently complete the entire sequence of processing steps, a number of processing chambers 108 are typically coupled to a central transfer chamber 104 that houses one or more robots 112 to facilitate transfer of the substrate 124 between the processing chambers 108. A semiconductor processing platform having this configuration is generally known as a cluster tool, examples of which are the family of CENTURA® and ENDURA® processing platforms available from Applied Materials, Inc. of Santa Clara, Calif.

Generally, a cluster tool 100 consists of a central transfer chamber 104 having one or more robots 112 disposed therein. The transfer chamber 104 is typically surrounded by one or more processing chambers 108, at least one load lock chamber 106. The processing chambers 108 are generally utilized to process the substrate 124, for example, performing various processing steps such as etching, physical vapor deposition, chemical vapor deposition, and the like. Processed and unprocessed substrates 124 are housed in a substrate storage cassette 130 disposed in a factory interface 102 coupled to the load lock chamber 106.

The load lock chamber 106 is isolated from the factory interface 102 and the transfer chamber 104 by slit valves 116. Substrates 124 enter the transfer chamber 104 from the substrate storage cassettes 130 one at a time through the load lock 106. The substrate 124 is first positioned in the load lock 106 after the substrate 124 is removed from the cassette 130. The load lock 106 is then sealed and pumped down to match the operating pressure of the substrate transfer chamber 104. The slit valve 116 between the load lock 106 and transfer chamber 104 is then opened, allowing the substrate transfer robots 112 to access the substrates 124 disposed in the factory interface 102. In this fashion, substrates 124 may be transferred into and out of the transfer chamber 104 without having to repeatedly re-establish transfer chamber vacuum levels after each substrate 124 passes through the load lock 106 or processing chambers 108. Although cluster tool 100 includes six processing chambers 108, any number may be used.

SUMMARY

A method and apparatus for semiconductor processing is disclosed. In one embodiment, a method of transporting a wafer within a cluster tool, comprises placing the wafer into a first segment of a vacuum enclosure, the vacuum enclosure being attached to a processing chamber and a factory interface. The wafer is transported to a second segment of the vacuum enclosure using a vertical transport mechanism, wherein the second segment is above or below the first segment.

The above and other preferred features of the invention, including various novel details of implementation and combination of elements, will now be more particularly described with reference to the accompanying drawings and pointed out in the claims. It will be understood that the particular methods and mechanisms embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

The accompanying drawings, which are included as part of the present specification, illustrate the presently preferred embodiment of the present invention and together with the general description given above and the detailed description of the preferred embodiment given below serve to explain and teach the principles of the present invention.

DETAILED DESCRIPTION

A method and apparatus for semiconductor processing is disclosed. In one embodiment, a method of transporting a wafer within a cluster tool, comprises placing the wafer into a first segment of a vacuum enclosure, the vacuum enclosure being attached to a processing chamber and a factory interface. The wafer is transported to a second segment of the vacuum enclosure using a vertical transport mechanism, wherein the second segment is above or below the first segment. According to another embodiment of the invention, unlike the robotic mechanisms described above that are used in the center of a platform, the present apparatus allows for a distributed linear wafer drive architecture. The linear architecture provided and described below does away with the need for radial dominated architectures.

In the following description, for purposes of explanation, specific nomenclature is set forth to provide a thorough understanding of the present invention. However, it will be apparent to one skilled in the art that these specific details are not required in order to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

Figure 2:
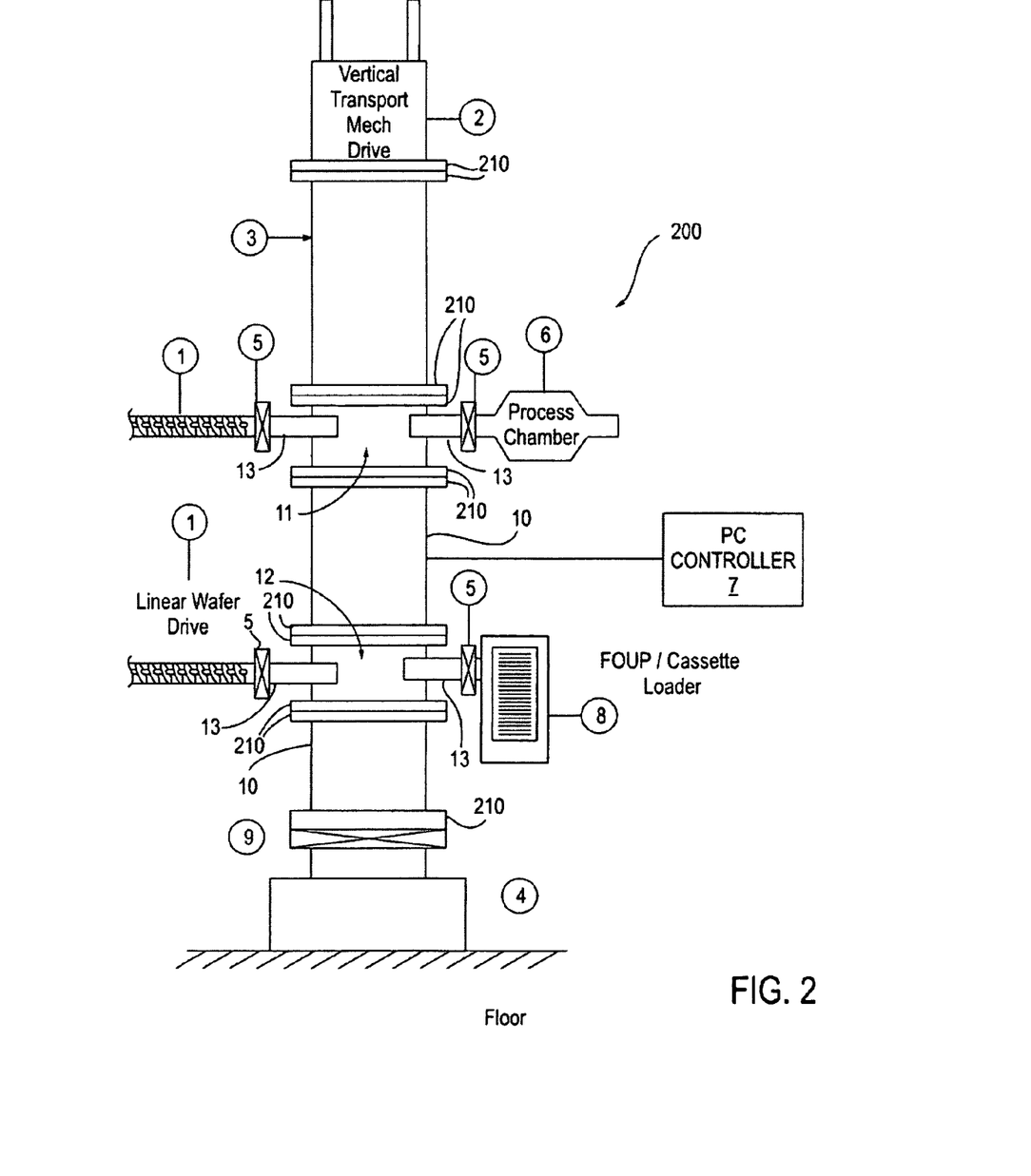
FIG. 2 illustrates an exemplary vertical transport cluster tool, according to one embodiment of the present invention.

FIG. 2 illustrates an exemplary vertical transport cluster tool, according to one embodiment of the present invention. Cluster tool 200 has a central vertical transport drive 2 within a vertically-oriented vacuum enclosure 3. Vacuum enclosure 3 may be made from polished stainless steel (or other similar type of metal or alloy) pipe sections with pipe flanges 210 according to one embodiment of the present invention. The pipe sections 10 may be finished and polished in a variety of ways, but—being enclosures for high vacuum movement of wafers, the pipe sections 10 follow specifications used in the semiconductor manufacturing industry. Flanges 210 at each end of each pipe section have diameter and hole patterns appropriate to the application. Flanges 210 are finished and grooved for o-ring seals and other similar high-vacuum seals.

Cluster tool 200 has three sections 10 separated by horizontal transport assemblies 11 and 12. At a lower end a pumping module 4 is sealed through a gate valve 9 to the vertical assembly of sections 10, 11 and 12. Pumping module 4 provides rough and high vacuum pumping to maintain vacuum within vacuum enclosure 3. Additionally, pumping module 4 can provide vacuum conditions for processing chamber 6. A vertical support drive 2 for a vertical transport mechanism (not shown within sections 10, 11 and 12) is positioned at the top end of the vertical assembly of pipe sections 10 and horizontal transport modules 11 and 12. The vertical transport mechanism and its drive 2 can be any of several sorts of elevator, such as an elevator actuator assembly manufactured by the Semiconductor Engineering Group, Inc.

Also included in cluster tool 200 is a horizontal transport assembly 12 that serves as a load and unload station for wafers in process. Horizontal transport assembly 12 also serves as a load lock-chamber with elevator mechanisms (not shown). Horizontal transport assembly 12 is mounted to a gate valve 5 via an extension 13. Extension 13 serves as an outer chamber of the transfer assembly, which is essentially a flanged section of stainless steel pipe. A linear wafer drive transport mechanism 1 mounts to a second extension 13 via another valve 5. Transport mechanism reaches through assembly 12 to bring wafers into the vertical transport mechanism and to place processed wafers from the vertical transport to a substrate storage cassette 8. Cassette 8 may be part of a factory interface, such as factory interface 102.

Horizontal transport assembly 11 is attached to a linear wafer drive transport mechanism 1 via a valve 5 and extension 13. A processing chamber 6 is isolated from the horizontal transport assembly 11 by valve 5 and extension 13. The processing chamber 6 may be a processing chamber such as chamber 108 of cluster tool 100, according to one embodiment. Additionally, processing chamber 6 may have a wafer carousel or other transporting mechanism such that a number of wafers may processed simultaneously.

Although only one drive mechanism 1 and chamber 6 (or cassette 8) are illustrated per assembly 11 and 12, additional drive mechanisms 1 may be used. The combination of linear drive 1 and horizontal assembly 11 eliminates the need for robots to transfer substrates into process chamber 6. Additionally, cluster tool 200 removes wafer transport mechanisms from within a center transfer chamber such as vacuum enclosure 3. Thus, linear drive 1 is external to vacuum enclosure 3 and operates to move substrates between processing chamber 6 and vacuum enclosure 3.

Figure 3:
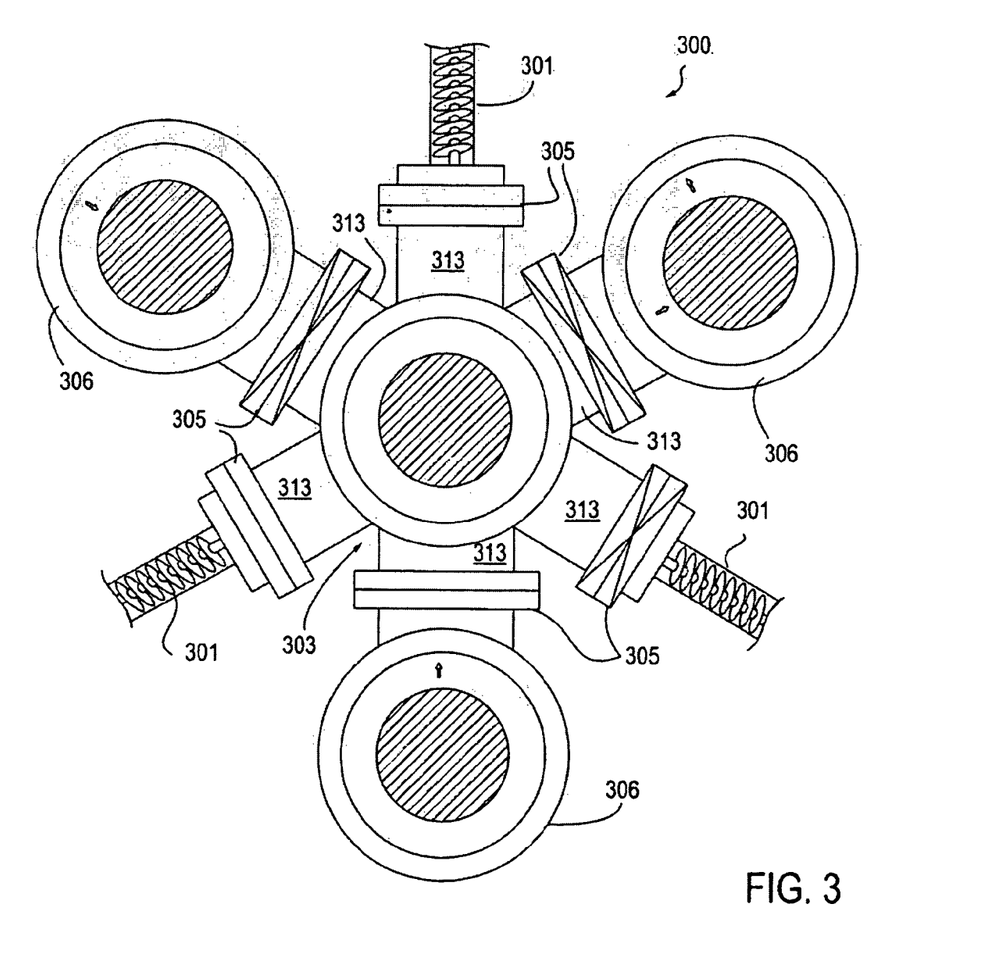
FIG. 3 illustrates an exemplary horizontal transport cluster tool, according to one embodiment of the present invention.

FIG. 3 illustrates an exemplary horizontal transport cluster tool 300, according to one embodiment of the present invention. Horizontal cluster tool 300 has three distinct processing chambers 306 and three cooperating linear transport drives 301 operating through gate valves 305. Processing chambers 306 are coupled to a vacuum chamber 303, where vacuum chamber 303 can be assembly 11 of vertical transport cluster tool 200. It is important to note that although one layer of chambers is illustrated in horizontal cluster tool 300, numerous layers can exist through vertical stacking along the vacuum chamber of a vertical cluster tool, such as vacuum chamber 3 of vertical cluster tool 200. For example, the horizontal transport cluster tool 300 can be attached as assembly 11, with an additional layer of components of horizontal transport cluster tool 300 mounted above or below assembly 11.

Additionally, any one of processing chambers 306 can be replaced with a factory interface such as factory interface 102. Horizontal cluster tool 300 includes linear transport drives 301 that transport substrate wafers between processing chambers 306 and vacuum enclosure 303. Linear transport drive 301 includes a blade (not shown) that extends through a gate valve 305, through extensions 313, through vacuum enclosure 303, through a second extensions 313, through a second gate valve 305 to a processing chamber 306, where linear transport drive 301 places or removes a substrate wafer. The blade 380 will be described in greater detail below.

Horizontal cluster tool 300 also includes an elevator mechanism 390 that transports a substrate to another level (assembly) of vertical transport cluster tool 200, according to one embodiment of the present invention. For example, a fresh wafer may be removed from cassette 8, vertically transport from assembly 12 to assembly 11. In one embodiment section 11 of FIG. 2 corresponds to vacuum enclosure 303 of FIG. 3 from which the fresh wafer may be distributed to any processing chamber 306.

The combination of linear drives 301 with vacuum enclosure 303 eliminates the need for robots to transfer substrates into process chambers 306. Additionally, cluster tool 300 removes wafer transport mechanisms from a center transfer chamber such as vacuum enclosure 303. Thus, linear drives 301 are external to vacuum enclosure 303 and operate to move substrates between processing chambers 306 and vacuum enclosure 303. In additional embodiments, any number of processing chamber 306 may be implemented around vacuum enclosure 303 according to the needs of the process.

Figure 4:
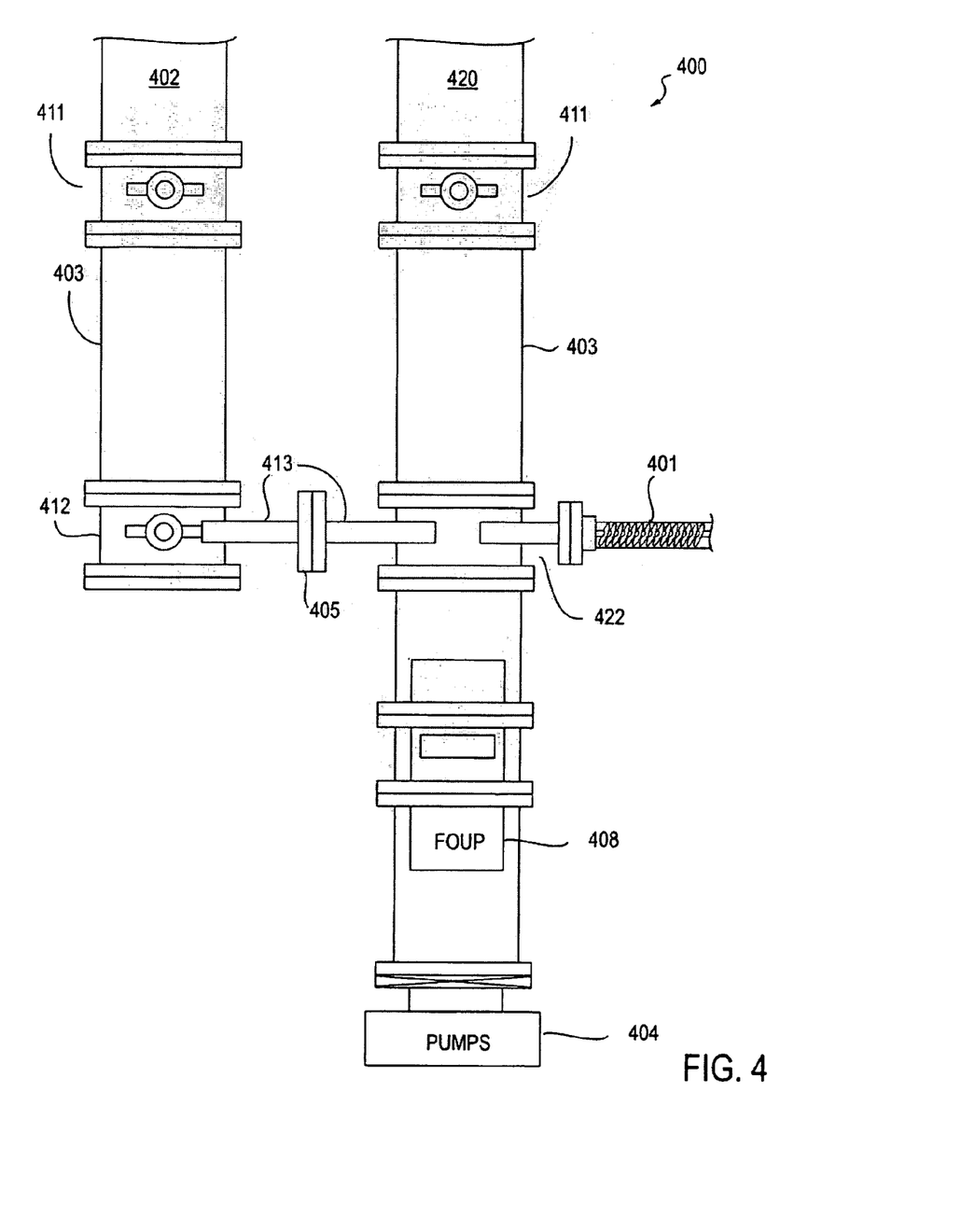
FIG. 4 illustrates an exemplary dual vacuum enclosure cluster tool, according to one embodiment of the present invention.

FIG. 4 illustrates an exemplary dual vacuum enclosure cluster tool 400, according to one embodiment of the present invention. Dual-vacuum enclosure cluster tool 400 has two vertical transport mechanisms (not shown) within each vacuum enclosure 403. Each vertical transport mechanism is driven by a vertical transport drive, such as vertical transport drive 402 and vertical transport drive 420. Vacuum enclosures 403 may be connected in a twin-tower arrangement such that a single cassette 8 within a company interface 102 may serve two separate vertical transports 403, which may support one or more horizontal cluster tools 300 inserted as horizontal assemblies 411. Note, that dual vacuum enclosure cluster tool 400 does not illustrate any processing chambers attached to horizontal assemblies 411.

Linear drive 401 transports one or more wafers between the two vacuum enclosures 403. For example, a wafer within section 422 is removed by linear drive 401, and carried to section 412 through extension 413 and gate valve 405, where vertical transport drive 402 elevates the wafer to horizontal assembly 411 for processing. In alternate embodiments, additional vacuum enclosures 403 may be interconnected to cluster tool 400 using additional linear drives 401, gate valves 405 and extensions 413.

Figure 5:
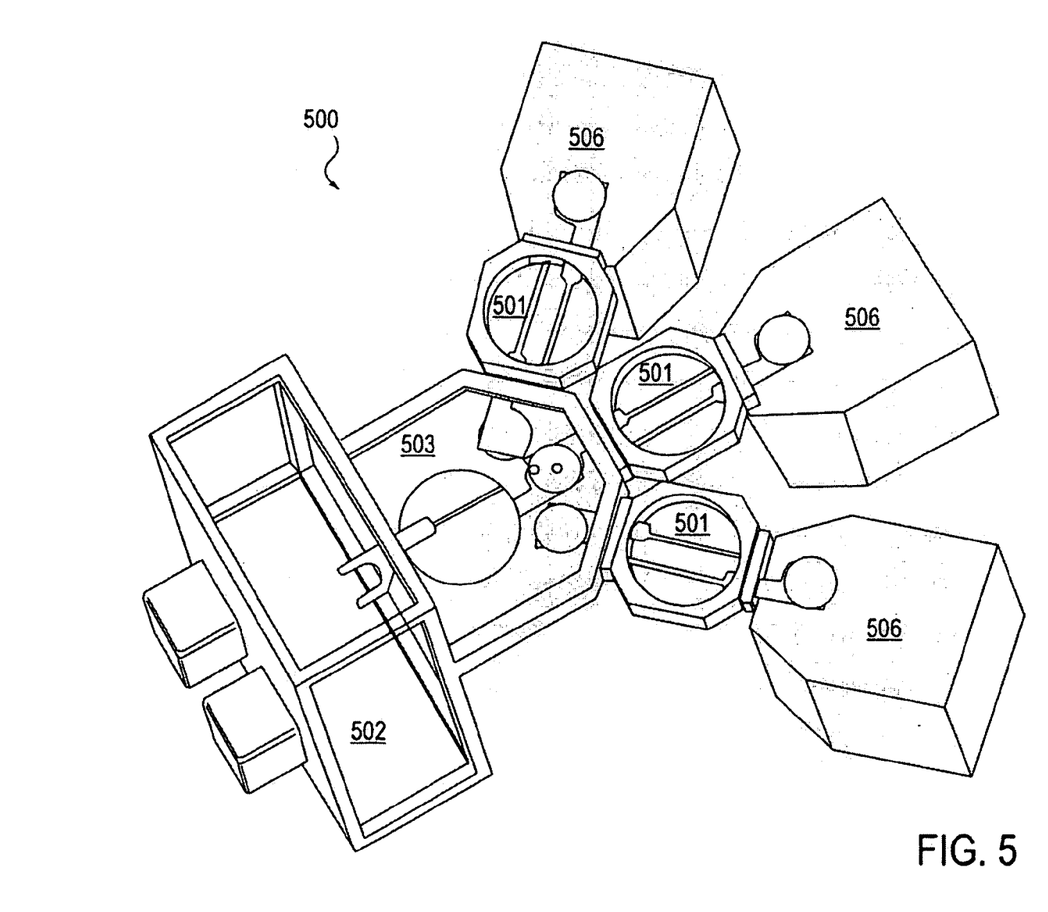
FIG. 5 illustrates an exemplary horizontal cluster tool, according to another embodiment of the invention.

FIG. 5 illustrates an exemplary horizontal cluster tool 500, according to another embodiment of the invention. Horizontal cluster tool 500 includes three processing chambers 506, although additional (or fewer) processing chambers can be used. A vacuum enclosure 503 is attached to a company interface 502. Attached between each processing chamber 506 and the vacuum enclosure 503 is a dual linear drive 501. Each dual linear drive 501 connects to processing chamber 506 and vacuum enclosure 503 through extensions and gate valves (not shown), according to one embodiment.

As illustrated in FIG. 5, dual linear drives 501 are disposed between vacuum enclosure 503 and processing chambers 506. This disposition is in direct contrast to horizontal cluster tool 300 in which its processing chamber separate the linear drives from the vacuum enclosure.

The combination of dual linear drives 501 with vacuum enclosure 503 eliminates the need for robots to transfer substrates into process chambers 506. Additionally, cluster tool 500 removes wafer transport mechanisms inside a center transfer chamber such as vacuum enclosure 303. Thus, dual linear drives 501 are external to vacuum enclosure 503 and operate to move substrates between processing chambers 506 and vacuum enclosure 503. A more detailed description of the operation of dual linear drives 501 is provided below.

Figure 6:
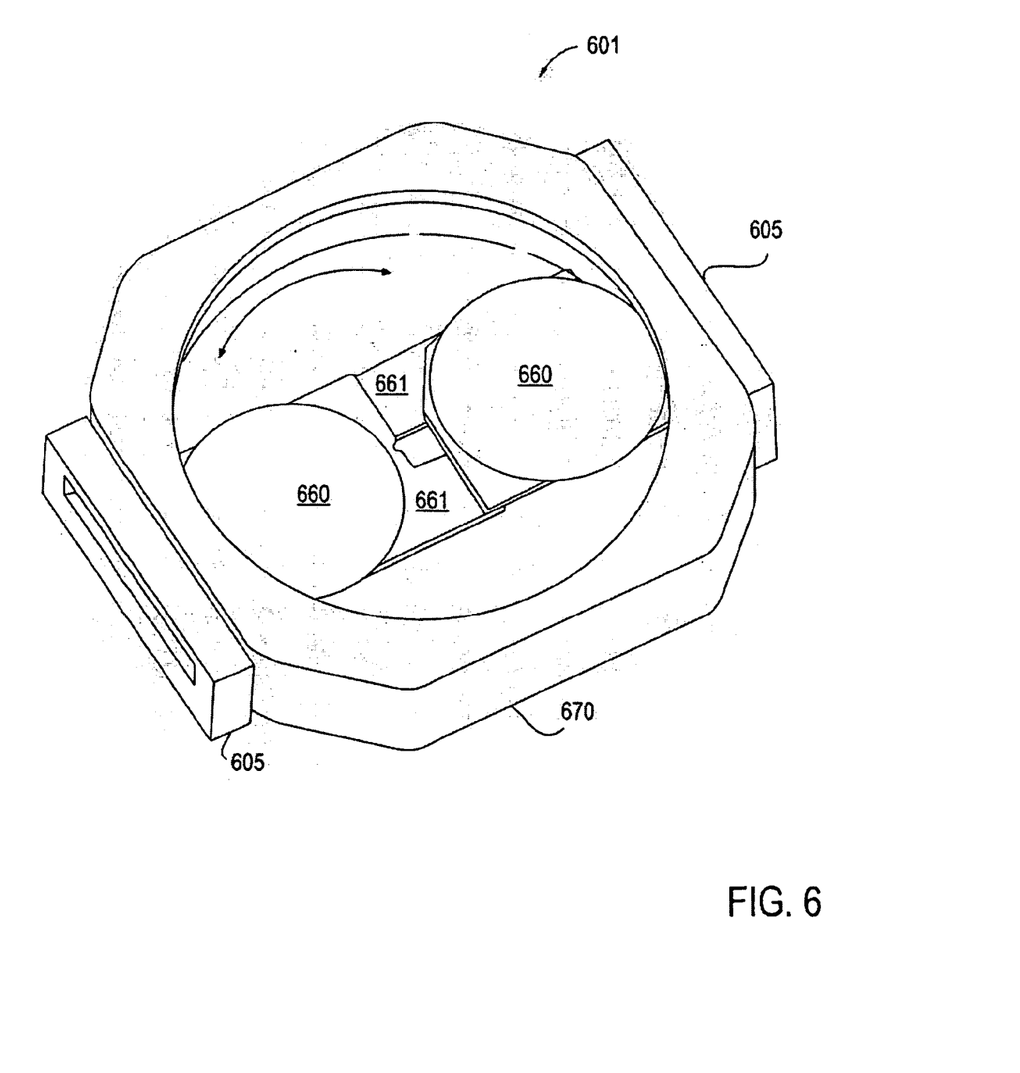
FIG. 6 illustrates an exemplary dual linear drive, according to one embodiment of the present invention.

FIG. 6 illustrates an exemplary dual linear drive 601, according to one embodiment of the present invention. Dual linear drive 601 operates to transport two wafers 660 between a vacuum chamber and a processing chamber (both not shown). The wafers 660 enter and exit through gate valves 605. Additionally, the wafers 660 sit upon blades 661. Besides extending from within enclosure 670 to processing chambers and vacuum chambers, blades 661 and wafers 660 can be rotated within enclosure 670 by one hundred and eighty (180) degrees. The rotation of blades 661 and wafers 660 will be described below.

The ability to rotate blades 661 and wafers 660 allows a fresh wafer to be placed within a processing chamber at the same time a processed wafer (removed from the same processing chamber) is returned to a vacuum enclosure. Dual linear drive 601 doubles the throughput of the a single wafer transport mechanism. Dual linear drive 601 is illustrated in a home position where both wafers 660 and both blades 661 are fully contained within enclosure 670.

Figure 7:
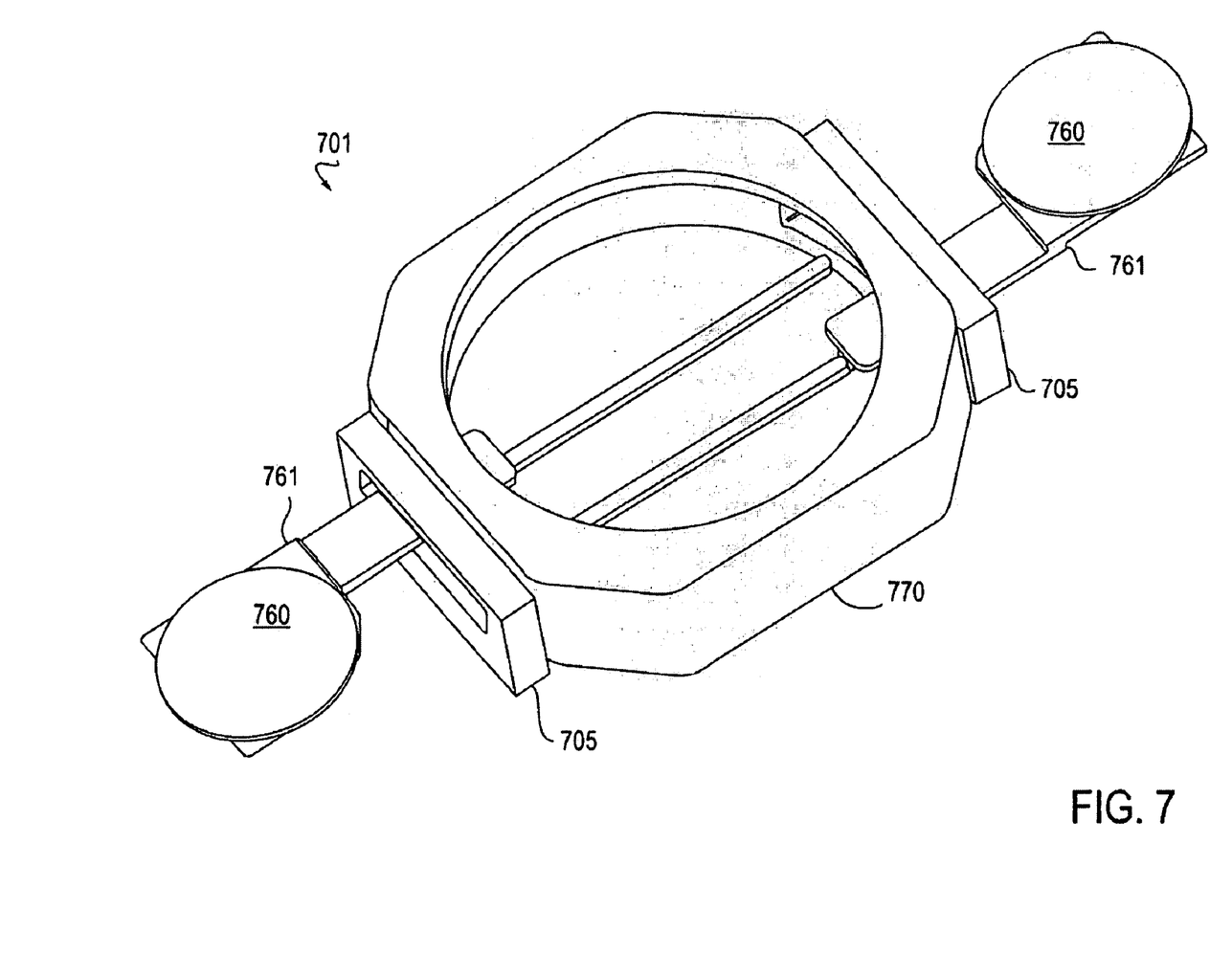
FIG. 7 illustrates an exemplary dual linear drive in an extended position, according to one embodiment of the present invention.

FIG. 7 illustrates an exemplary dual linear drive 701 in an extended position, according to one embodiment of the present invention. Dual linear drive 701 includes an enclosure 770 having two gate valves 705. Dual linear drive 701 has both blades 761 extended such that wafers 760 are outside enclosure 770, having passed through gate valves 705. Wafers 760 can then be placed within a processing chamber or vacuum enclosure (or taken from a processing chamber or vacuum enclosure). In alternate embodiments, one blade and wafer may be kept within enclosure 770, while the second blade and wafer is extended.

Figure 8:
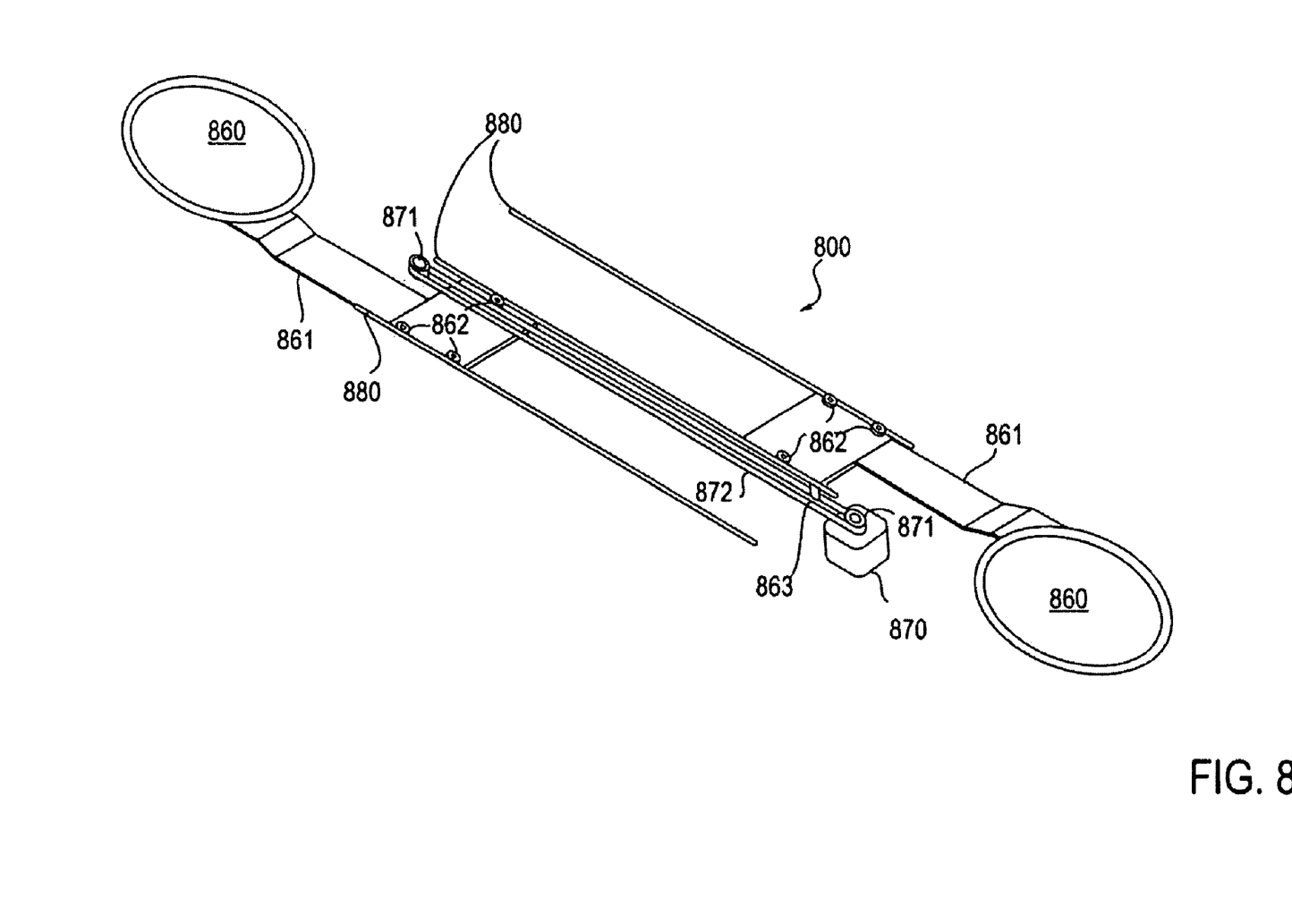
FIG. 8 illustrates an exemplary dual linear drive mechanism, according to one embodiment of the present invention.

FIG. 8 illustrates an exemplary dual linear drive mechanism 800, according to one embodiment of the present invention. Drive mechanism 800 transports two wafers 860 into and out of an enclosure (not shown) using blades 861 that support wafers 860. Blades 861 glide along rails 880 via rollers 862. According to one embodiment, three rollers 862 are used per blade, although any number may be used. Rails 880 are shaped to mate with grooves within rollers 862 that resemble pulley wheels, according to one embodiment. In an alternate embodiment, ball bearings are used to allow blades 861 to glide within rails 880.

Blades 861 are moved using motor 870 in combination with pulleys 871, belt 872 and attachment tabs 863. Pulleys 871 are placed along the center rail, such that belt 872 can be stretched between them for the entire length of the rails 880. Motor 870 rotates one pulley 871 causing belt 872 to move along the center rail. Each blade 861 is attached to the belt 872 via attachment tabs 863 (one not shown). Thus, as the belt 872 moves, blades 861 carry wafers 860 into or out of the enclosure. The direction the motor 870 spins pulley 871 is reversed to reverse the motion of blades 861.

The rails are made from stainless steel according to one embodiment. The pulleys are made from stainless steel, according to one embodiment, although other materials including ceramics, carbon fiber, aluminum, and similar materials can be used as well.

According to another embodiment, dual linear drive mechanism 800 is modified to be a single linear drive mechanism, such as linear drives 201, 301, and 401. Only one blade 861 is used with two rails 880, and no rotational mechanism is provided. Similarly, in another embodiment, if a single blade linear drive is desired as a substitute for the dual linear drives 501, a single blade can be used as described with the ability to rotate one hundred and eighty (180) degrees. In this example, a wafer can be removed from a process chamber, rotated within the enclosure of the linear drive and then placed in a vacuum enclosure. Then a fresh wafer can be placed into the process chamber from the vacuum enclosure using the same process in reverse.

Figure 9:
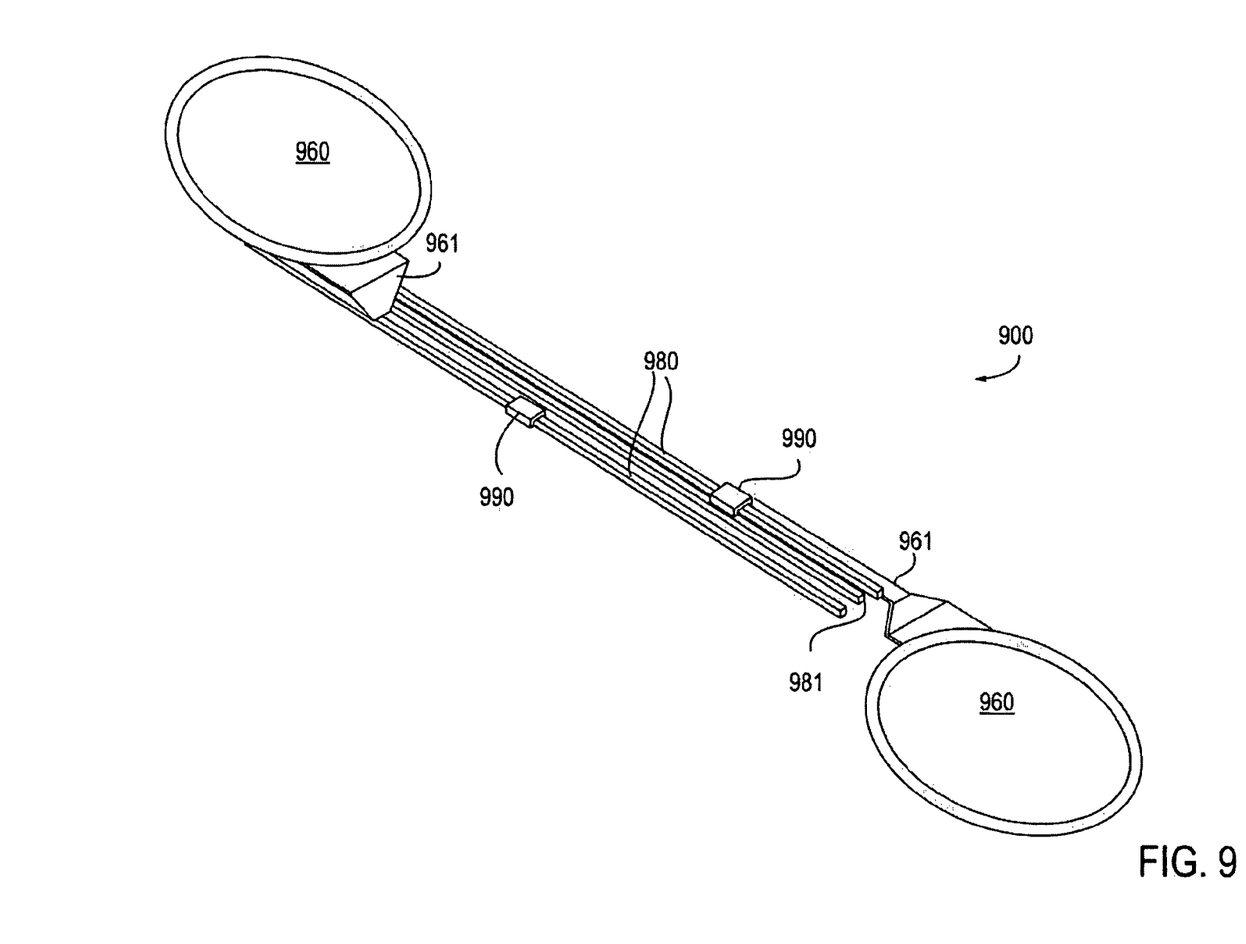
FIG. 9 illustrates an exemplary dual linear drive mechanism, according to another embodiment of the present invention.

FIG. 9 illustrates an exemplary dual linear drive mechanism 900, according to another embodiment of the present invention. Drive mechanism 900 transports two wafers 960 into and out of an enclosure (not shown) using blades 961 that support wafers 960. Blades 961 glide along rails 980 via rolling guide 990. According to one embodiment, one rolling guide 990 is used per blade, although any number may be used. Rails 980 are shaped to mate with grooves within rolling guide 990.

Blades 961 are moved using a small piezoelectric motor (not shown) in combination with rolling guide 990, and ceramic strip 981. The motor is fixed to the side of rolling guide 990 closest to the ceramic strip 981. When energized the motor moves rolling guide 990 along the ceramic strip 981 and glide on top of rail 980. The direction of the motor can be reversed to reverse the motion of blades 861.

The rails 980 are made from stainless steel according to one embodiment, but can also be manufactured from aluminum or other similar substances. The rails 980 can be a rail such as those manufactured by IKO International, Inc. of Japan. The rolling guide 990 can be a Solid lubrication linear motion rolling guide, such as those manufactured by IKO International, Inc. of Japan. According to one embodiment, the motor is a piezoelectric motor such as the HR Series solid state motors manufactured by Nanomotion, Ltd. of Israel.

Figure 10:
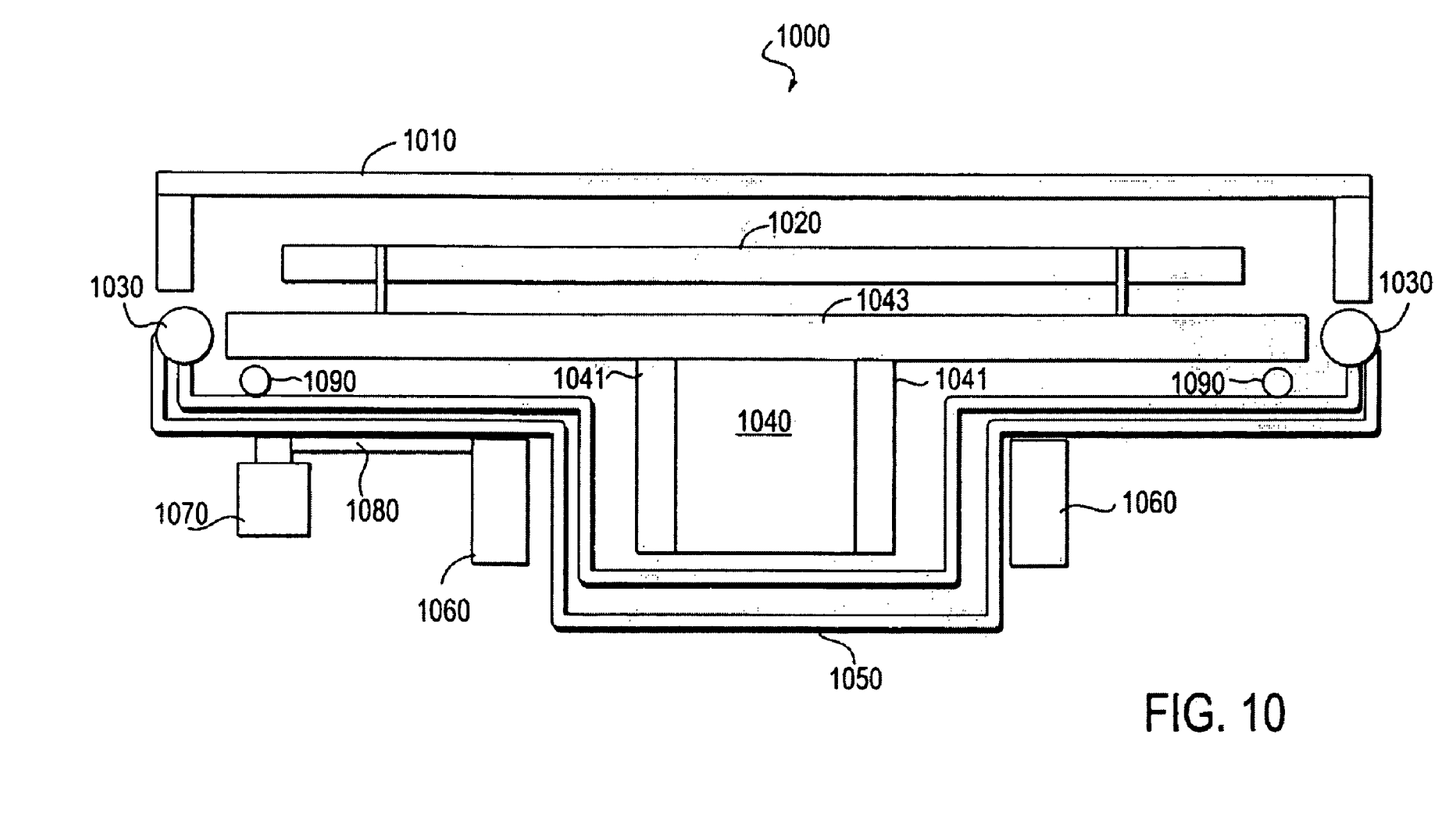
FIG. 10 illustrates an exemplary linear drive with a rotation mechanism, according to one embodiment of the present invention.

FIG. 10 illustrates an exemplary linear drive 1000 with a rotation mechanism, according to one embodiment of the present invention. Linear drive 1000 includes a top enclosure 1010 and a bottom enclosure 1050 sealed by an O-ring 1030. Both the top enclosure 1010 and bottom enclosure 1050 can be constructed from aluminum, stainless steel, carbon fiber, or similar material. The O-ring 1030 allows for the sealing of linear drive 1000 to create vacuum conditions within. Mechanism 1020 is any one of the linear drive mechanisms described above, including rails, blades and other supporting architecture.

The mechanism 1020 is mounted to backing plate 1043, according to one embodiment. In alternate embodiments, a backing plate 1043 is not used. Backing plate 1043 along with mechanism 1020 rotate in a circular fashion over the bottom enclosure 1050 on bearings 1090. The bearings 1090 can sit within a circular track grooved into the bottom enclosure 1050, according to one embodiment. Attached to the bottom side of the backing plate is a spindle 1040 surrounded by one or more permanent magnets 1041. The elements described thus far, exist within a vacuum sealed environment.

The spindle 1040, backing plate 1043, and mechanism 1020 are caused to rotate by one or more ring magnets 1060 outside the bottom enclosure 1050. The ring magnets 1060 are connected to a motor 1070 via a belt 1080. By causing the motor 1070 to rotate the belt 1080 moves ring magnet 1060, ultimately turning the mechanism 1120 within linear drive 1000.

Figure 11:
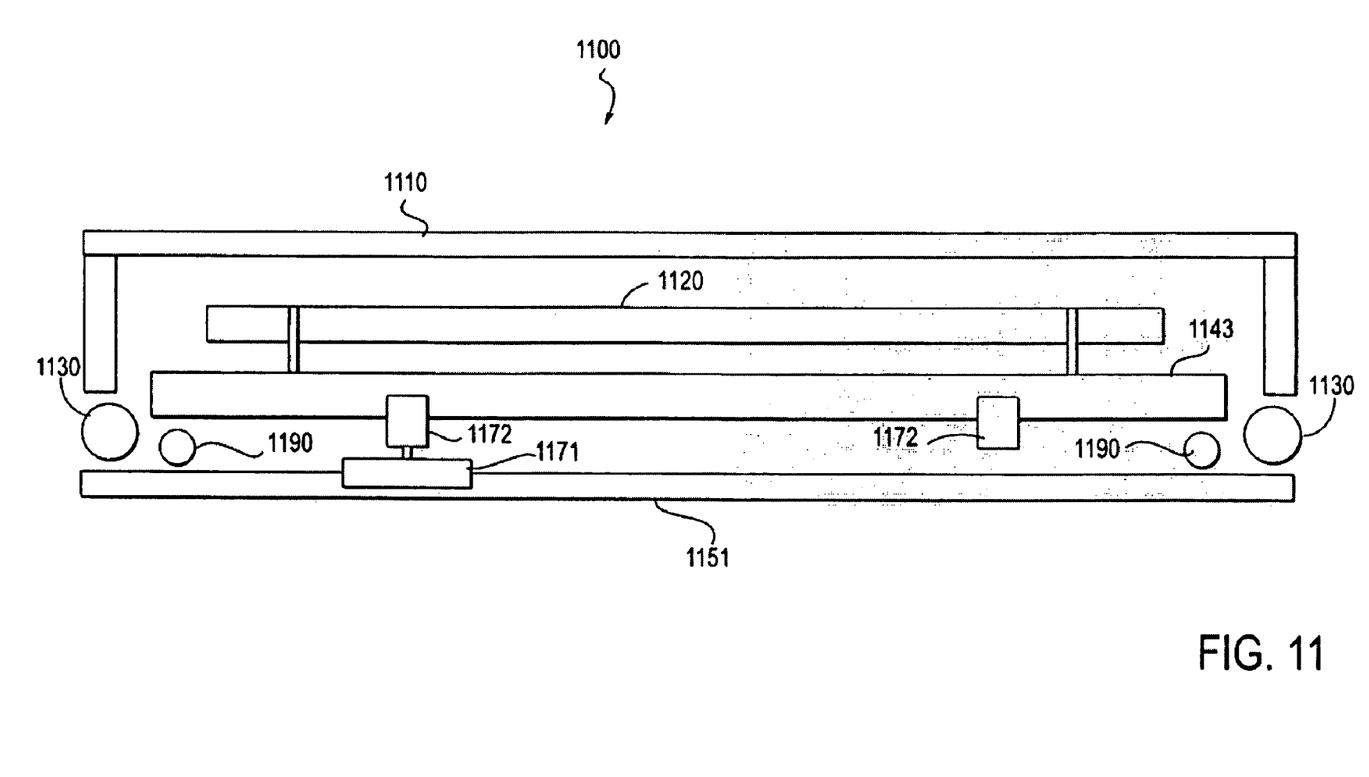
FIG. 11 illustrates an exemplary linear drive with a rotation mechanism, according to another embodiment of the present invention.

FIG. 11 illustrates an exemplary linear drive 1100 with a rotation mechanism, according to another embodiment of the present invention. Linear drive 1100 includes a top enclosure 1110 and a bottom enclosure 1151 sealed by an O-ring 1130. Both the top enclosure 1110 and bottom enclosure 1151 can be constructed from aluminum, stainless steel, carbon fiber, or similar material. The O-ring 1130 allows for the sealing of linear drive 1100 to create vacuum conditions within. Mechanism 1120 is any one of the linear drive mechanisms described above, including rails, blades and other supporting architecture.

The mechanism 1120 is mounted to backing plate 1143, according to one embodiment. In alternate embodiments, a backing plate 1143 is not used. Backing plate 1143 along with mechanism 1120 rotate in a circular fashion over the bottom enclosure 1151 on bearings 1190. The bearings 1190 can sit within a circular track grooved into the bottom enclosure 1151, according to one embodiment. Attached to the bottom side of the backing plate 1143 is a circular guide ring 1172 constructed from ceramic, according to one embodiment. Attached to the bottom enclosure 1151 is a motor 1171. Motor 1171 can be a piezoelectric motor such as the HR Series solid state motors manufactured by Nanomotion, Ltd. of Israel. Both the motor 1171 and guide ring 1172 can be glued into their respective positions. The elements described thus far, exist within a vacuum sealed environment. The backing plate 1143, and mechanism 1120 are caused to rotate when the motor 1171 is energized causing the portion of the motor 1171 to contact and move the guide ring 1172.

Figure 12:
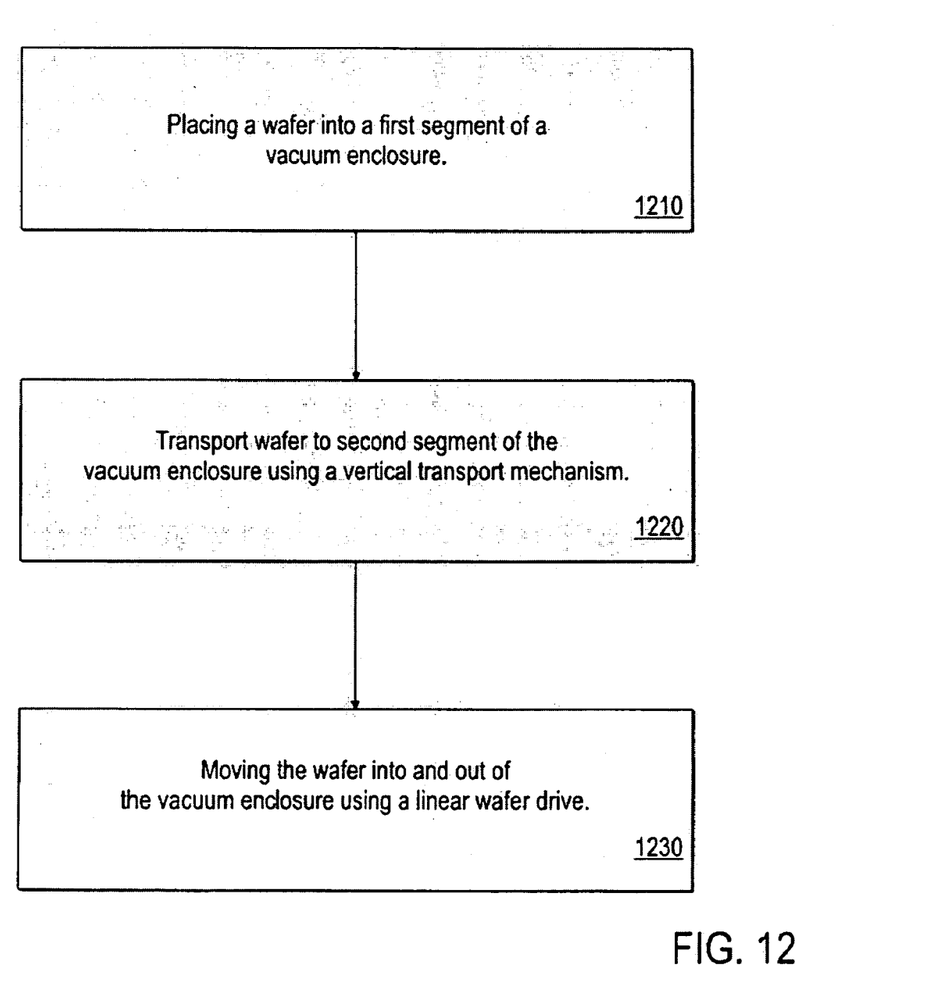
FIG. 12 illustrates an exemplary method of transporting a wafer, according to one embodiment of the present invention.

FIG. 12 illustrates an exemplary method of transporting a wafer, according to one embodiment of the present invention. A wafer, such as wafer 660 is placed into a first segment of a vacuum enclosure, such as assembly 12 of vacuum enclosure 3. (block 1210) Linear wafer drive 1 physically moves the wafer into and out of vacuum enclosure 3. Vertical transport mechanism and drive 2 transports the wafer to a second segment of the vacuum enclosure, such as assembly 11. (block 1220) The wafer can then be removed from vacuum enclosure 3 by another linear wafer drive 1, and into a processing chamber 6. (block 1230)

Figure 13:
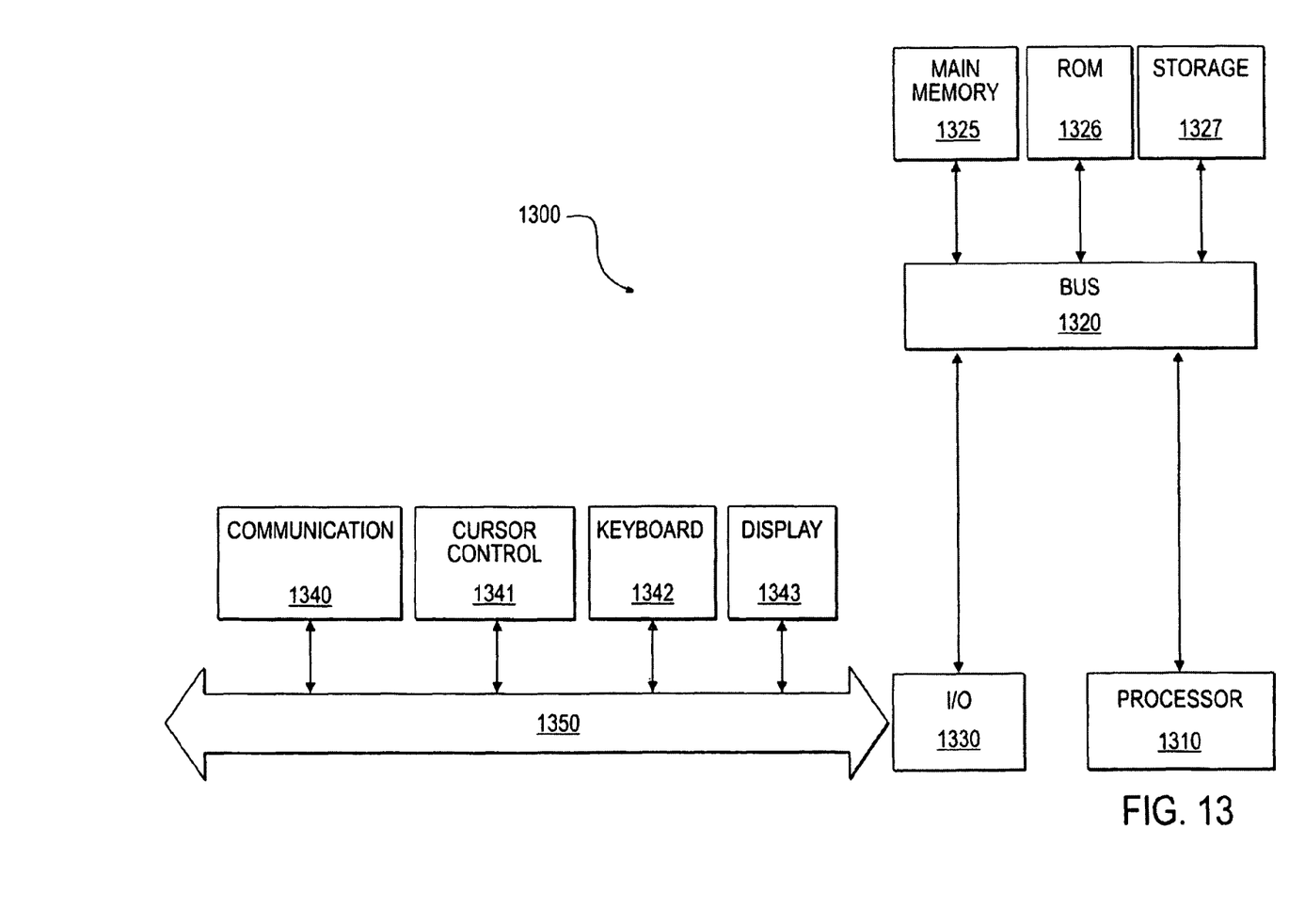
FIG. 13 illustrates a computer system representing an integrated multi-processor, in which elements of the present invention may be implemented.

Cluster tools, such as those described above are controlled by a PC-type computer motion control system with software included. The software running on the computer directs the movement of wafers between chambers and enclosures. FIG. 13 illustrates a computer system 1000 representing an integrated multi-processor, in which elements of the present invention may be implemented. The system 1300 may represent a computer used to control the cluster tools described above such as computer 7 of FIG. 2.

One embodiment of computer system 1300 comprises a system bus 1320 for communicating information, and a processor 1310 coupled to bus 1320 for processing information. Computer system 1300 further comprises a random access memory (RAM) or other dynamic storage device 1325 (referred to herein as main memory), coupled to bus 1320 for storing information and instructions to be executed by processor 1310. Main memory 1325 also may be used for storing temporary variables or other intermediate information during execution of instructions by processor 1310. Computer system 1300 also may include a read only memory (ROM) and/or other static storage device 1326 coupled to bus 1320 for storing static information and instructions used by processor 1310.

A data storage device 1327 such as a magnetic disk or optical disc and its corresponding drive may also be coupled to computer system 1300 for storing information and instructions. Computer system 1300 can also be coupled to a second I/O bus 1350 via an I/O interface 1330. A plurality of I/O devices may be coupled to I/O bus 1350, including a display device 1343, an input device (e.g., an alphanumeric input device 1342 and/or a cursor control device 1341). For example, web pages and business related information may be presented to the user on the display device 1343.

The communication device 1340 is for accessing other computers (servers or clients) via a network. The communication device 1340 may comprise a modem, a network interface card, or other well known interface device, such as those used for coupling to Ethernet, token ring, or other types of networks.

The devices described herein may use simple, mostly off-the-shelf linear wafer movement mechanisms, and motion control software. The present cluster tools have many applications, such as all thin film deposition, anneal, and etch processes in use in memory chip and microprocessor manufacturing.

A method and apparatus for semiconductor processing is disclosed. Although the present invention has been described with respect to specific examples and subsystems, it will be apparent to those of ordinary skill in the art that the invention is not limited to these specific examples or subsystems but extends to other embodiments as well. The present invention includes all of these other embodiments as specified in the claims that follow.

We claim:

1. A method of transporting a wafer within a plurality of cluster tools, comprising:
   placing the wafer into a first vacuum enclosure of a first cluster tool of the plurality of cluster tools, the first vacuum enclosure being connected to a first processing chamber and a factory interface;
   transporting the wafer from the first vacuum enclosure of the first cluster tool to a second vacuum enclosure of a second cluster tool of the plurality of cluster tools across a vertical transport path using a vertical transport mechanism,
   wherein the second vacuum enclosure is connected to a second processing chamber and the second cluster tool is disposed along the vertical transport path above or below the first cluster tool, and
   wherein the second vacuum enclosure is colinear with the vertical transport path and is positioned at the end of the vertical transport path.

2. The method of claim 1, further comprising:
   moving the wafer into and out of the first vacuum enclosure using a linear wafer drive, wherein the linear wafer drive is external to the first vacuum enclosure.

3. The method of claim 2, further comprising:
   controlling the linear wafer drive and the vertical transport mechanism with a computer executing mechanism control software.

4. The method of claim 3, wherein moving the wafer into and out of the first vacuum enclosure includes moving the wafer through a gate valve, the gate valve being connected to the first vacuum enclosure.

5. The method of claim 4, wherein moving the wafer into and out of the first vacuum enclosure includes moving the wafer through an extension having two ends, the extension being connected at one end to the gate valve and at the other end to the first vacuum enclosure.

6. The method of claim 3, wherein moving the wafer into and out of the first vacuum enclosure includes moving the wafer between the first vacuum enclosure and the first processing chamber.

7. The method of claim 6, wherein the linear wafer drive is simultaneously moving a second wafer between the first vacuum enclosure and the first processing chamber.

8. The method of claim 3, wherein moving the wafer into and out of the first vacuum enclosure includes moving the wafer between the factory interface and the first vacuum enclosure.

9. The method of claim 3, wherein moving the wafer into and out of the first vacuum enclosure includes moving the wafer through a gate valve, the gate valve being connected to the first processing chamber.

10. The method of claim 9, wherein moving the wafer into and out of the first vacuum enclosure includes moving the wafer through an extension having two ends, the extension being connected at one end to the gate valve and at the other end to the first vacuum enclosure.

11. The method of claim 2, further comprising:
    moving the wafer into and out of a third vacuum enclosure using the linear drive, wherein the third vacuum enclosure is disposed in the second cluster tool.

12. The method of claim 11, wherein moving the wafer into and out of a third vacuum enclosure includes moving the wafer through a gate valve having two sides, the gate valve being connected at one side to the first vacuum enclosure and at the other side to the third vacuum enclosure.

13. The method of claim 12, wherein moving the wafer into and out of a third vacuum enclosure includes moving the wafer through an extension having two ends, the extension being connected at one end to the gate valve and at the other end to the third vacuum enclosure.

14. The method of claim 12, wherein moving the wafer into and out of a third vacuum enclosure includes moving the wafer through an extension having two ends, the extension being connected at one end to the gate valve and at the other end to the first vacuum enclosure.

15. The method of claim 1, wherein a pumping module maintains vacuum conditions to the first vacuum enclosure and the second vacuum enclosure.

16. The method of claim 1, wherein the first vacuum enclosure is a load-lock chamber.

17. The method of claim 1, wherein the second vacuum enclosure is a load-lock chamber.

* * * * *